United States Patent [19]
Yoon

[11] Patent Number: 5,989,944
[45] Date of Patent: Nov. 23, 1999

[54] METHOD OF FABRICATING SELF-ALIGNED THIN FILM TRANSISTOR USING LASER IRRADIATION

[75] Inventor: Jung-Kee Yoon, Kyongki-do, Rep. of Korea

[73] Assignee: LG Electronics Inc., Seoul, Rep. of Korea

[21] Appl. No.: 08/920,005

[22] Filed: Aug. 29, 1997

[30] Foreign Application Priority Data

Aug. 30, 1996 [KR] Rep. of Korea ...................... 96-36718

[51] Int. Cl.[6] .............................. H01L 21/00; H01L 21/84
[52] U.S. Cl. .......................... 438/149; 438/151; 438/158; 438/160; 438/166
[58] Field of Search ................................... 438/149, 151, 438/158, 160, 166

[56] References Cited

U.S. PATENT DOCUMENTS

| | | |
|---|---|---|
| 5,656,511 | 8/1997 | Shindo . |
| 5,658,805 | 8/1997 | Young . |
| 5,661,050 | 8/1997 | Den Boer et al. . |
| 5,696,011 | 12/1997 | Yamazaki et al. . |
| 5,733,804 | 3/1998 | Hack et al. . |
| 5,827,763 | 2/1996 | Seo . |
| 5,846,855 | 5/1996 | Igarashi et al. . |

OTHER PUBLICATIONS

Kawachi et al., "A Novel Technology for a–Si TFT–LCD's with Buried ITO Electrode Structure," IEEE Transactions on Electron Devices, vol. 41, No. 7, Jul. 1994.

Lustig et al, "Gate dielectric and contact effects in hydrogenated amorphous silicon–silicon nitride thin film trnasistors," J. Appl. Phys. 65(10), May 15, 1989.

Chang Dong–Kim et al, "Eximer–Laser Crystallized Poly–Si TFT's with Transparent Gate," IEEE Transactions on Electron Devices, vol., 43, No., 4, Apr. 4, 1996.

Sameshima, et al, "Analysis of Dopant Diffusion in Molten Silicon Induced by a Pulsed Eximer Laser," Japanese Journal of Applied Physics, vol. 26, No. 7 pp. L1208–L1210, Jul. 1987.

Chang–Doon Kim et al., "Amorphous–Silicon TFT's with Self–Aligned Poly–Silicon Source and Drain," Materials Research Society Symposium Proceeding Vo. 297, pp. 925–930, 1993.

*Primary Examiner*—John F. Niebling
*Assistant Examiner*—Jonathan Hack
*Attorney, Agent, or Firm*—Morgan, Lewis & Bockius LLP

[57] ABSTRACT

A method of manufacturing an inverse-staggered self-aligned thin film transistor on a substrate having a front surface and a back surface is provided. The method includes the steps of (a) forming a gate electrode over the front surface of the substrate,(b) forming a gate insulating layer over the gate electrode,(c) forming a semiconductor active layer over the gate insulating layer adjacent the gate electrode. The method further includes the steps of (d) forming an impurity-doped semiconductor layer over the active layer and (e) radiating a laser beam from the back side of the substrate using the gate electrode as a mask to substantially crystallize portions of the active layer and the impurity-doped semiconductor layer to define source and drain regions in the active layer.

24 Claims, 9 Drawing Sheets

METHOD OF FABRICATING SELF-ALIGNED THIN FILM TRANSISTOR USING LASER IRRADIATION

This application claims the benefit of Korean Application No. 96-36718, filed on Aug. 30, 1996, which is hereby incorporated by reference.

BACKGROUND OF THE INVENTION

1. Field of the Invention

The present invention relates to a method of fabricating a thin film transistor (TFT), and more particularly, to a method of fabricating a self-aligned TFT in which the structure thereof is fabricated in a self-aligned manner.

2. Discussion of the Related Art

In a large sized high-resolution TFT liquid crystal display, a self-aligned TFT is used as a pixel switching element to increase the aperture ratio and decrease the power consumption. The self-aligned TFT has a smaller overlap portion between the gate electrode and the source electrode than a conventional inverse staggered TFT. Thus, for a fixed channel width-to-length ratio (W/L), parasitic capacitance Cgs of the self-aligned TFT is smaller than that of the inverse staggered TFT. Pixel voltage shift level ΔVp, which causes flickers and gray level errors, is proportional to parasitic capacitance Cgs. Accordingly, it is important to decrease the parasitic capacitance Cgs in order to reduce pixel voltage shift level ΔVP.

If the self-aligned TFT having a smaller pixel voltage shift level ΔVp is used as a pixel switching element, the aperture ratio can be improved and power consumption is decreased. Furthermore, with the self-aligned TFT, process tolerance does not affect its fabrication, and accordingly, it is possible to manufacture a TFT that has a very short channel. The shorter channel length requires smaller drain-source current Ids to charge a capacitor. Thus, the channel width can also be decreased with the reduction of the channel length since drain-source current Ids is proportional to W/L. This further decreases parasitic capacitance Cgs. For reference, parasitic capacitance is proportional to W(L/2+ΔL), where ΔL is an overlap length, a constant.

Figure 1A:
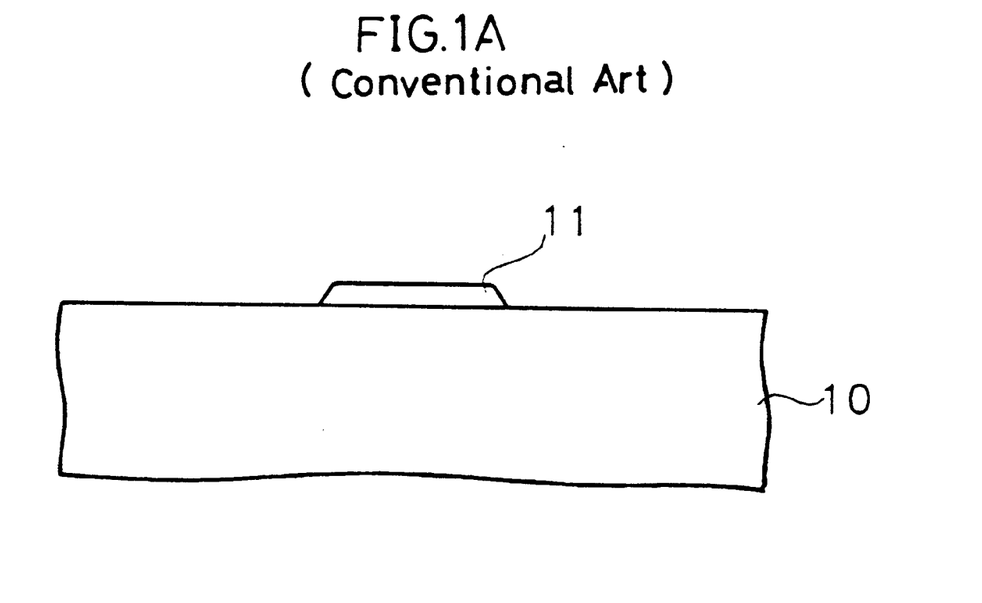
FIGS. 1A to 1F are cross-sectional views showing a conventional method of fabricating a self-aligned TFT.
Figure 1B:
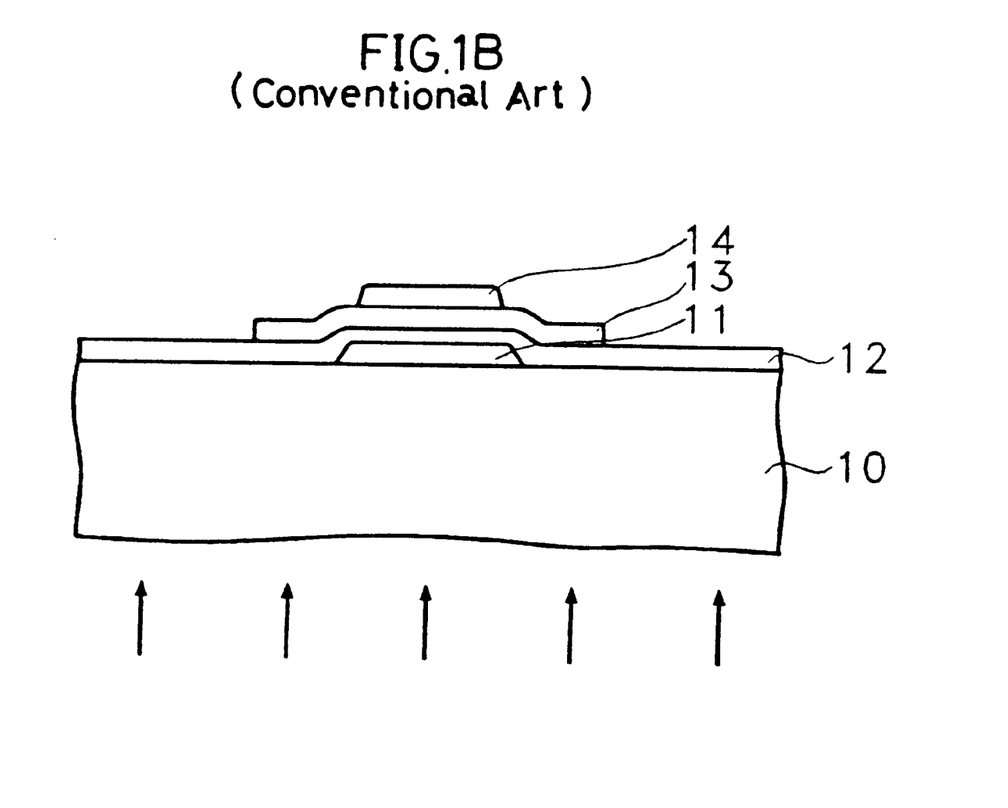

FIGS. 1A to 1F are cross-sectional views showing a conventional method of fabricating a self-aligned TFT. Referring to FIG. 1A, a conductive material, such as Al or Cr, is deposited on a glass substrate 10, and patterned to form a gate electrode 11. Referring to FIG. 1B, a silicon oxide layer ($SiO_2$) and/or silicon nitride layer ($Si_3N_4$) is deposited on the overall surface of the glass substrate including gate electrode 11 to form a gate insulating layer 12 in a single- or double-layered structure. An amorphous silicon is deposited on gate insulating layer 12 to form an active layer 13. Thereafter, a silicon oxide layer, silicon nitride layer or insulating layer is formed on a predetermined portion of active layer 13 to form an ion-implantation stop layer 14.

Figure 1C:
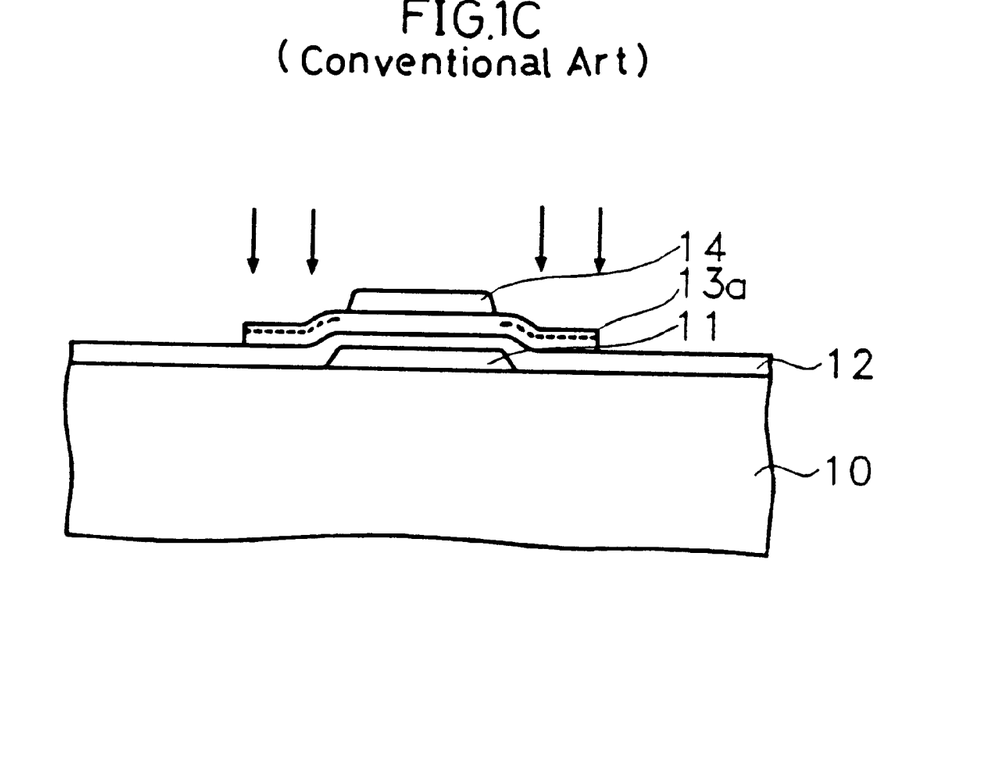
Figure 1D:
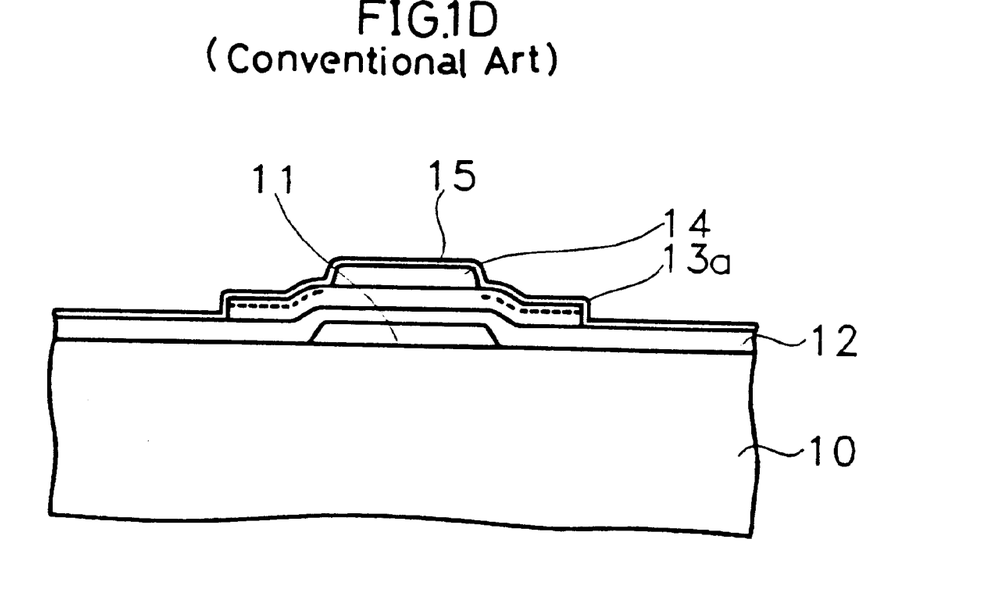

In forming the above structure of ion-implantation stop layer/active layer/gate insulating layer, the silicon oxide layer (or silicon nitride layer), amorphous silicon layer, and the insulating layer (silicon oxide layer, silicon nitride layer, or insulating layer having photosensitivity) are sequentially formed, and the insulating layer and amorphous silicon layer are patterned. Here, in patterning the ion-implantation stop layer, a photolithographic process is performed by exposing a photoresist or the insulating layer having photosensitivity from the backside of the glass substrate 10 using gate electrode 11 as a mask. Referring to FIG. 1C, ion shower doping is performed to the exposed portions of active layer 13 to form shallow $n^+$ regions. Referring to FIG. 1D, a metal layer 15 for forming a silicide, such as W or Mo, is deposited on the entire surface of the glass substrate 10 including ion-implantation stop layer 14, portions of active layer 13a in which the $n^+$ regions are formed, and exposed portions of gate insulating layer 12.

Figure 1E:
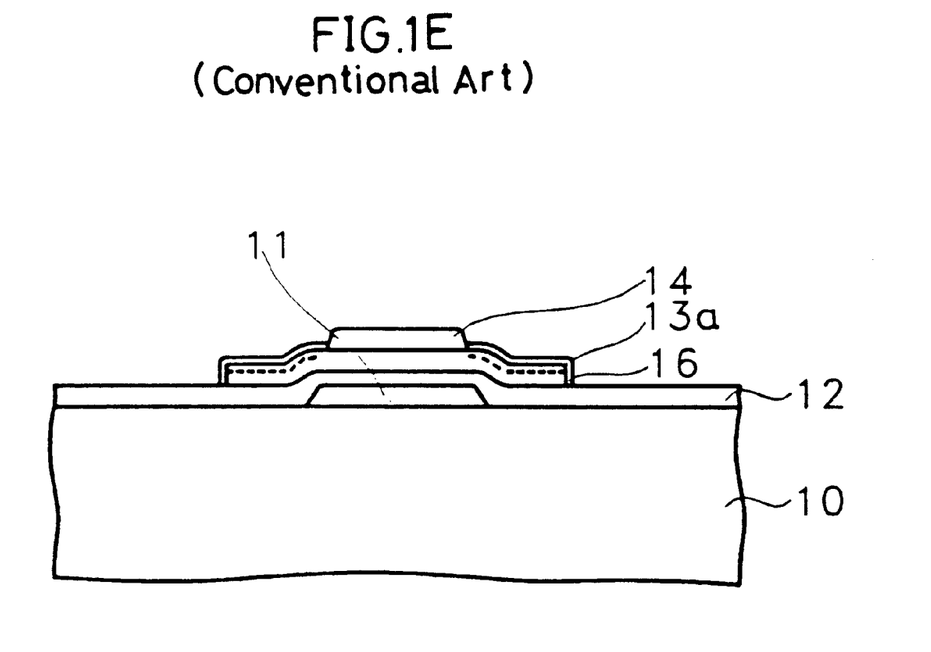
Figure 1F:
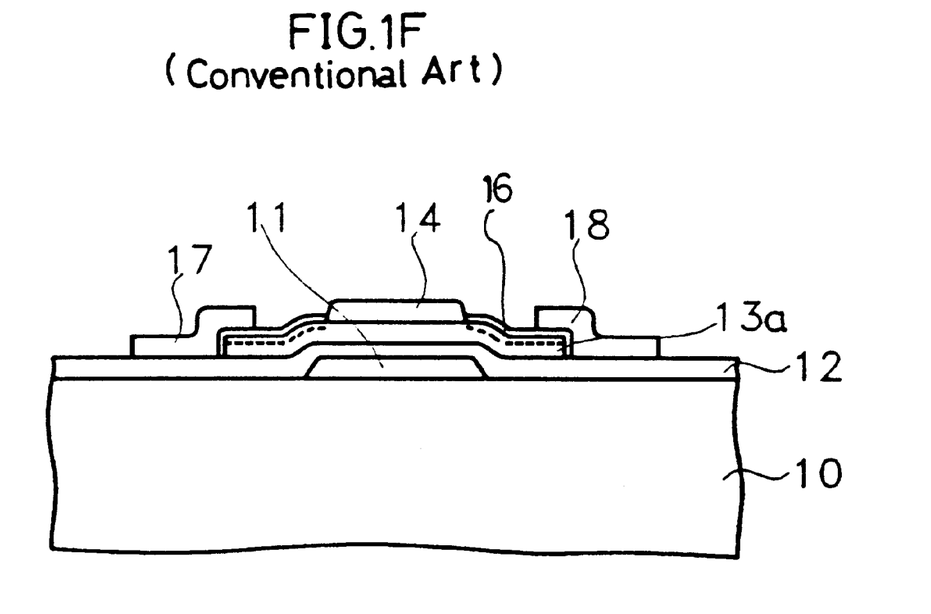

Referring to FIG. 1E, annealing is carried out to form a silicide layer 16 at the interface between the metal layer and the portions of active layer 13a in which the $n^+$ regions are formed. The metal layer 15 remains unchanged on the other regions. Subsequently, the metal layer 15 is etched. Since the metal has etch selectivity to silicide, silicide layer 16 formed on active layer 13 a remains as it is when etching the metal. Referring to FIG. 1F, a metal, such as Al or Cr, is deposited on the overall surface of the glass substrate 10, and selectively removed to form source and drain electrodes 17, 18 contacting silicide layer 16 on the respective sides.

The above-described self-aligned TFT fabrication method requires more masks than a conventional TFT fabrication method, resulting in a complicated manufacturing process. Furthermore, since exposure is performed from the backside of the glass substrate in a self-aligned manner to form the ion-implantation stop layer, longer exposure time is necessary, and accordingly, throughput is sacrificed.

To form a perfect silicide layer, the annealing should be carried out at a temperature of above 600° C. When the self-aligned TFT is applied to a liquid crystal display, silicide cannot completely and uniformly be formed, since the upper limit in processing temperature exists when using a glass substrate. Thus, it is difficult to achieve uniform characteristics of TFT over the entire area of the substrate. In the case of a quartz substrate, the formation of perfect silicide layer is possible but fabrication cost becomes high.

Figure 2:
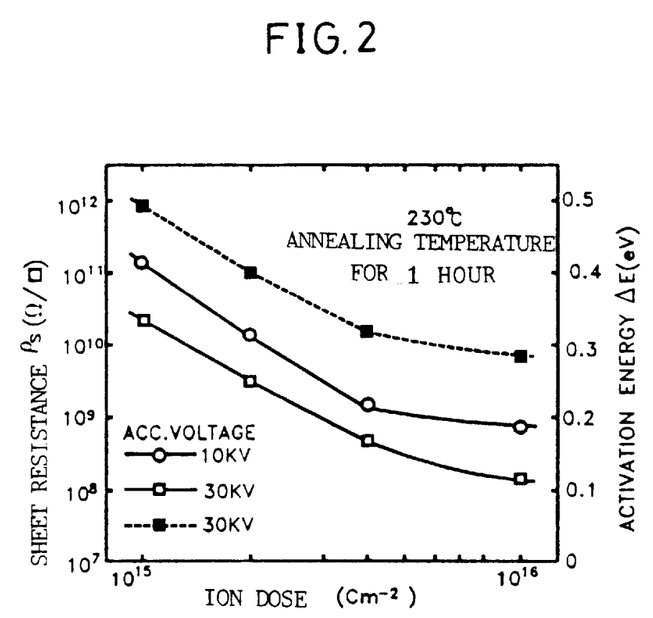
FIG. 2 is a graph showing the relation between the ion acceleration voltage and the sheet resistance of an $n^+$ layer formed by ion shower doping.

Moreover, as shown in FIG. 2, because the $n^+$ region is formed on the active layer using ion shower doping, its resistance is larger than that of a normal $n^+$-amorphous silicon layer. Accordingly, the $n^+$ regions act as series resistors during the device operation. These series resistances affect the measured effective mobility of the amorphous silicon forming the active layer. The effective mobility can be calculated using a current relation formula modified according to the resistance of the $n^+$ regions, as follows:

$$\mu = \frac{\mu_0}{1 + 2R_s \frac{W}{L} \mu_0 C_i (V_G - V_T)} \quad (1)$$

Figure 3:
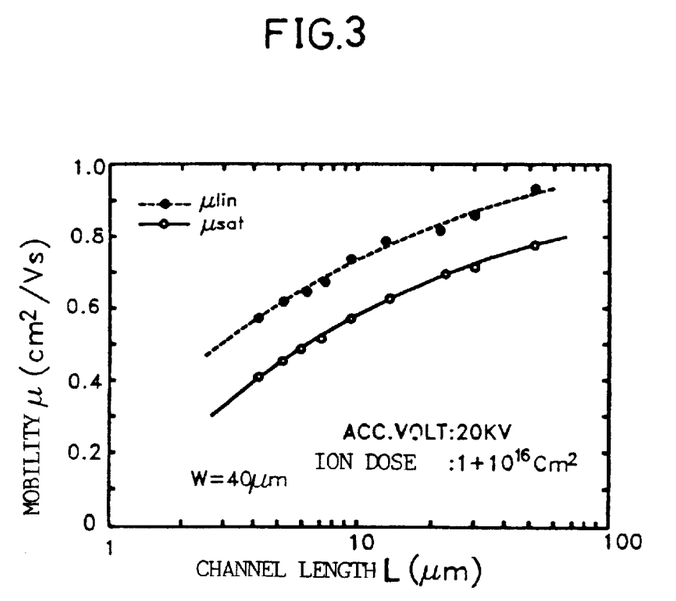
FIG. 3 is a characteristic graph showing the relation between the channel length and the mobility of the conventional TFT.

Where, $\mu$ is the effective mobility to be measured, $\mu_0$ is the mobility of amorphous silicon TFT itself, $R_s$ is the series resistance of $n^+$ regions, W/L is ratio of channel width W to channel length L, $V_G$ is the gate voltage, and $V_T$ is the threshold voltage of the TFT. As shown in formula (1), the measured mobility $\mu$ decreases as the channel length L becomes shorter. FIG. 3 is a characteristic graph showing the relation between the channel length and the measured mobility. This shows how mobility $\mu_{lin}$ in the linear region and mobility $\mu_{sat}$ in the saturation region decrease with the channel length L (Ion dose $1\times10^{16}$ $cm^{-2}$ in $n^+$ region, channel width W=40μm). So, the charging cannot be improved as much as inversely-proportional to the channel length.

SUMMARY OF THE INVENTION

Accordingly, the present invention is directed to a method of fabricating a self-aligned TFT that substantially obviates the problems due to limitations and disadvantages of the related art.

An object of the present invention is to provide a simple method of fabricating a self-aligned TFT, by which a fully self-aligned TFT is manufactured with no mobility reduction effect due to source/drain resistance even with a short channel length.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of fabricating a self-aligned TFT on a transparent insulating substrate, the method including the steps of (a) forming a gate electrode on the transparent insulating substrate; (b) forming a gate insulating layer over the gate electrode; (c) forming an active layer made of amorphous silicon over the gate insulating layer adjacent the gate electrode; (d) performing plasma treatment on the surface of the active layer; and (e) radiating a laser beam from the back side of the transparent insulating substrate using the gate electrode as a mask to crystallize portions of the active layer, the crystallized portions of the active layer corresponding to ohmic contact regions.

In another aspect, the present invention provides a method of manufacturing an inverse-staggered self-aligned thin film transistor on a substrate having a front surface and a back surface, the method including the steps of (a) forming a gate electrode over the front surface of the substrate; (b) forming a gate insulating layer over the gate electrode; (c) forming a semiconductor active layer over the gate insulating layer adjacent the gate electrode; (d) forming an impurity-doped semiconductor layer over the active layer; and (e) radiating a laser beam from the back side of the substrate using the gate electrode as a mask to substantially crystallize portions of the active layer and the impurity-doped semiconductor layer to define source and drain regions in the active layer.

In a further aspect, the present invention provides a method of manufacturing an inverse-staggered self-aligned thin film transistor on a substrate having a front surface and a back surface, the method including the steps of (a) forming a gate electrode over the front surface of the substrate; (b) forming a gate insulating layer over the gate electrode; (c) forming an amorphous semiconductor active layer over the gate insulating layer adjacent the gate electrode; (d) forming an impurity-doped amorphous semiconductor layer over the active layer; (e) radiating a laser beam from the back side of the substrate using the gate electrode as a mask to substantially crystallize portions of the active layer and the impurity-doped semiconductor layer to define source and drain regions in the active layer; and (f) selectively etching a portion of the impurity-doped semiconductor layer that is located over the gate electrode and is left uncrystallized in step (e).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

According to a method of fabricating a self-aligned TFT of the present invention, a laser crystallization is performed after plasma treatment, without using the ion shower doping or ion-implantation stop layer. Furthermore, the present invention does not use the silicide layer which causes non-uniform characteristics of TFT.

Figure 4A:
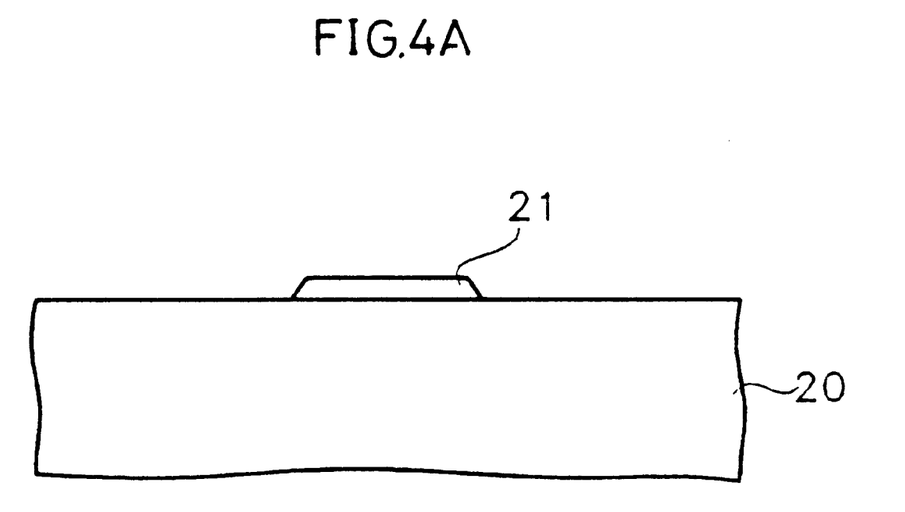
FIGS. 4A to 4F are cross-sectional views showing a method of fabricating a self-aligned TFT according to the present invention.

FIGS. 4A to 4F are cross-sectional views showing a method of fabricating a self-aligned TFT according to an embodiment of the present invention. Referring to FIG. 4A, a metal material, such as Cr, Al, and AlTa, is deposited on a glass substrate 20 by sputtering or the like, and then patterned to form a gate electrode 21. Here, the surface of gate electrode 21 may be anodic-oxidized, depending on the characteristics of the metal forming the gate electrode, to form an anodic oxide layer (not shown).

Figure 4B:
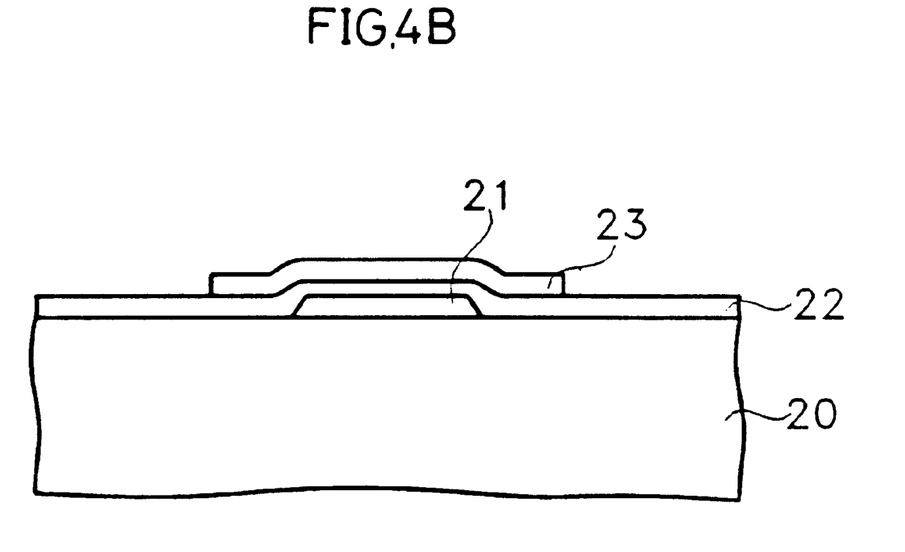

Referring to FIG. 4B, a silicon oxide layer or silicon nitride layer is formed on the overall surface of glass substrate 20 including gate electrode 21 by chemical vapor deposition (CVD) or the like to form a gate insulating layer 22 in a single- or double-layered structure. Thereafter, amorphous silicon is deposited on gate insulating layer 22 using CVD or the like, and patterned to form an active layer 23 over and the both sides of the gate electrode 21.

Figure 4C:
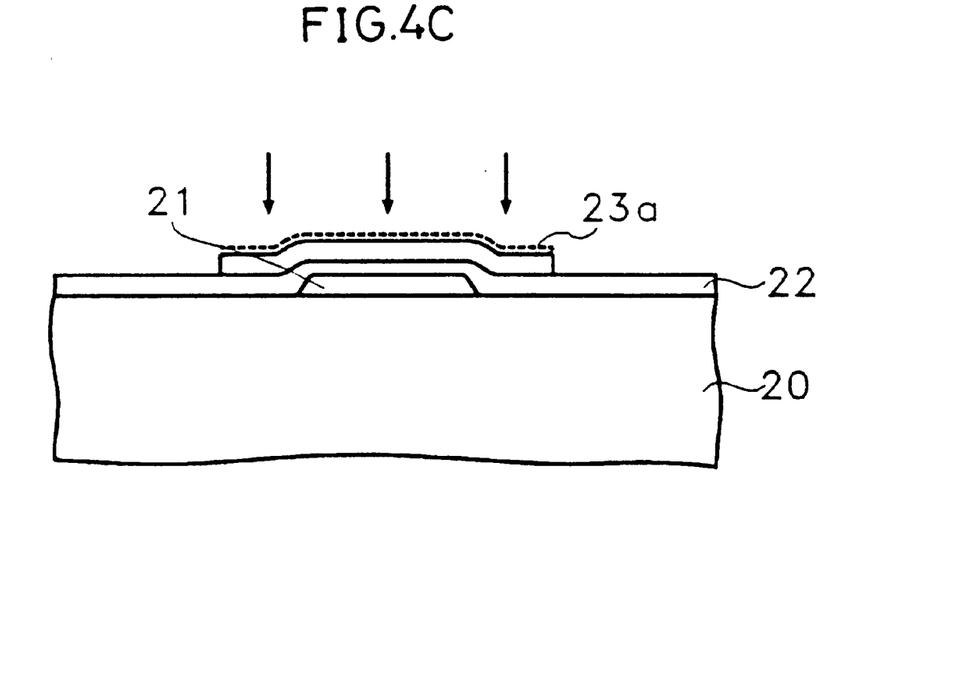
Figure 4D:
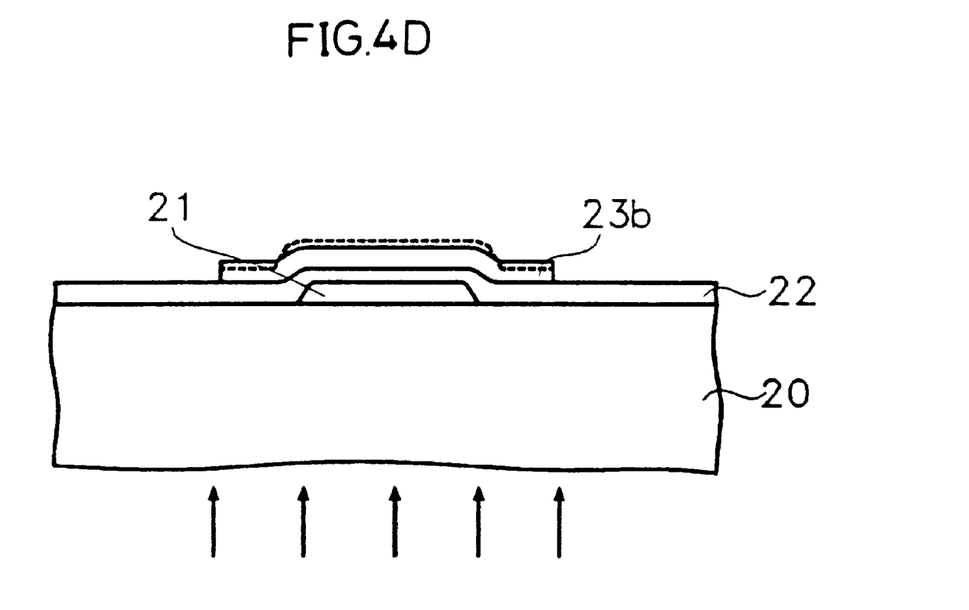

Referring to FIG. 4C, active layer 23 is plasma-treated by plasma enhanced chemical vapor deposition (PECVD) or the like using 1% $PH_3/H_2$ gas, to dope $n^+$ ions to its surface. Here, the gas used in the plasma treatment may be a gas containing P ions. Reference numeral 23a denotes a portion of the active layer into which $n^+$ ions are doped. Referring to FIG. 4D, a laser beam is directed toward the back surface of the glass substrate 20 to crystallize portions of active layer 23 that are not located over gate electrode 21. Thus, the source and drain regions are crystallized, whereas a channel region over gate electrode 21 remains as amorphous silicon. During the crystallization, the $n^+$ dopant ions on the surface of the active layer diffuse into the active layer. Reference numeral 23b denotes a portion of the active layer corresponding to this ion-diffused, crystallized source and drain regions.

Figure 4E:
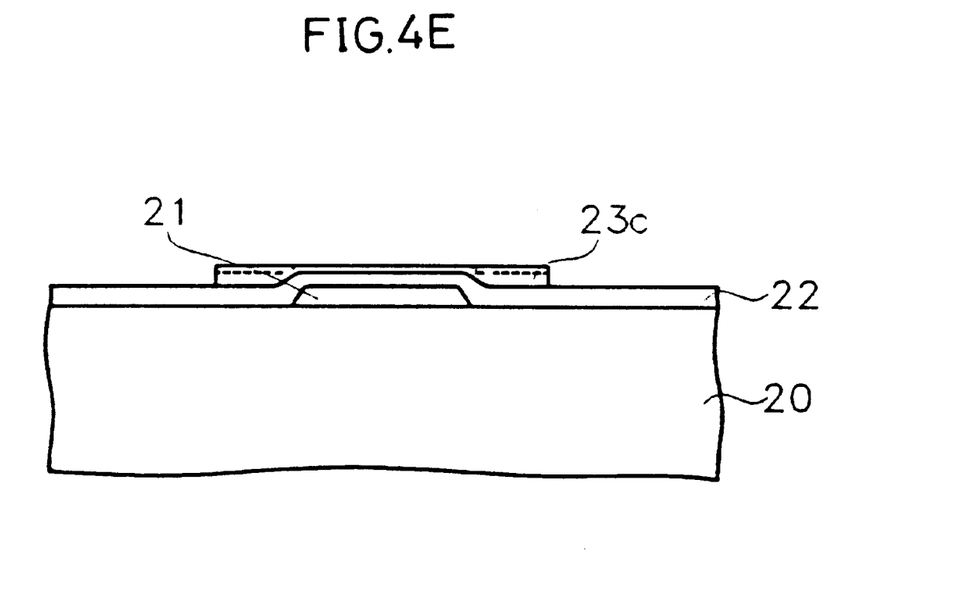
Figure 4F:
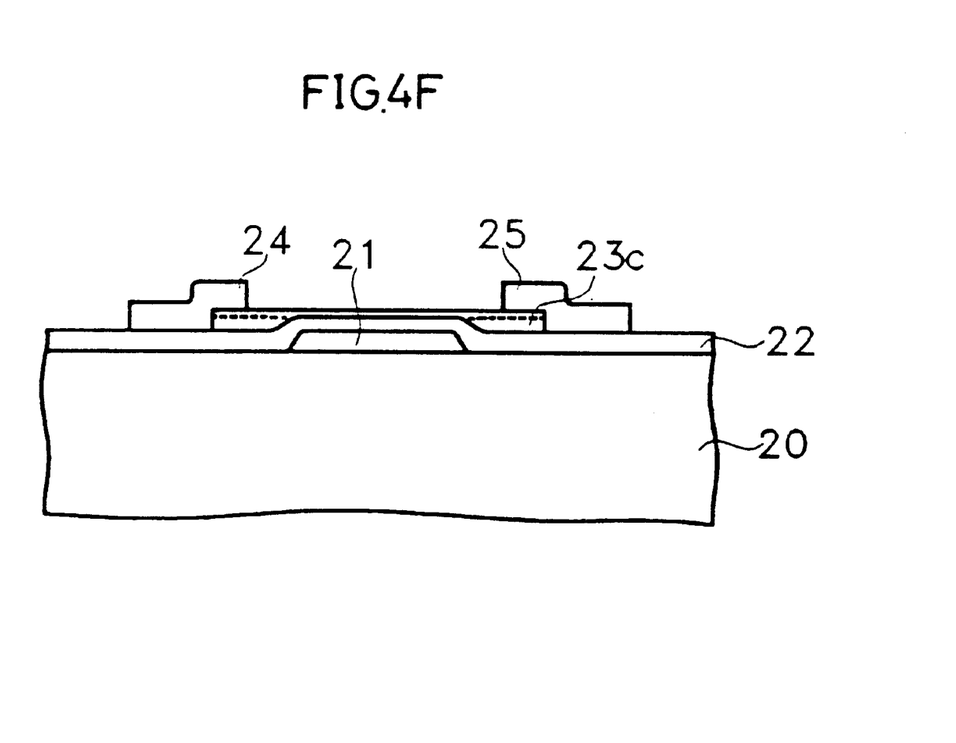

Referring to FIG. 4E, the $n^+$ ion layer and the active layer that correspond to the amorphous channel region over the gate electrode 21 is etched by a predetermined amount using etch selectivity of amorphous silicon to crystallized silicon. This process is performed by tuning the condition of dry etching to have the optimum selectivity, for example. This etching process may be omitted. Reference numeral 23c denotes the active layer, in which a portion of its surface over the channel region is removed. Referring to FIG. 4F, a metal, such as Cr or Al, is deposited on the overall surface of the substrate including active layer 23c, and is patterned to form source and drain electrodes 24, 25 contacting the active layer 23c at its both sides to be separated by a predetermined distance. This completes the fabrication of the TFT according to the present invention.

Figure 5A:
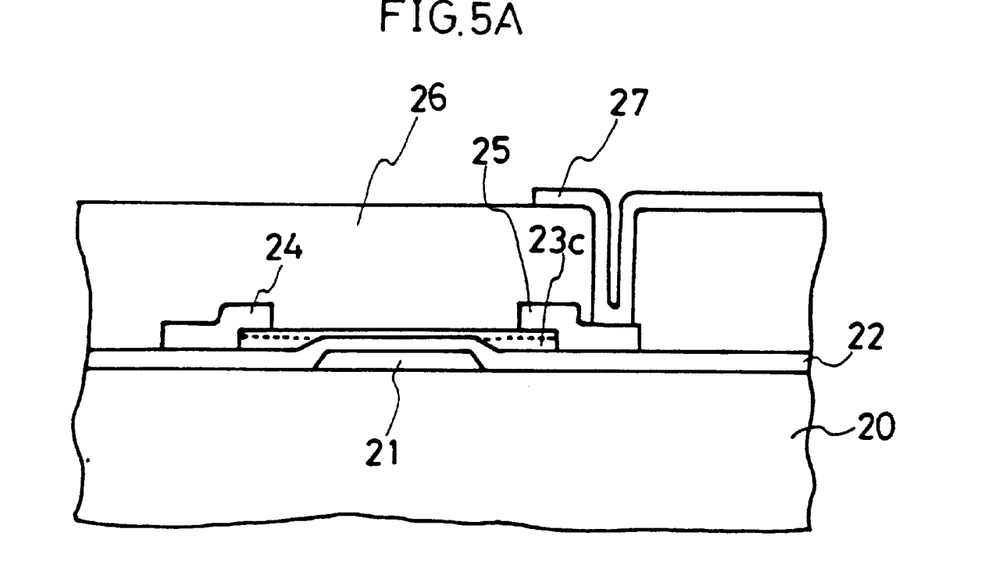
FIGS. 5A to 5D are cross-sectional views respectively showing the first, second, third and the fourth embodiments of a self-aligned TFT according to the present invention.

FIGS. 5A to 5D are cross-sectional views respectively showing the first, second, third and the fourth embodiments in which the amorphous silicon TFT of the present invention is applied to a liquid crystal display. Referring to FIG. 5A, after the step shown in FIG. 4F, a passivation layer 26 is formed of a silicon nitride or silicon oxide on the overall surface of the substrate to protect the TFT, and is selectively etched to form a contact hole exposing a portion of drain electrode 25. Thereafter, a transparent conductive material is deposited on the overall surface of the substrate, and patterned to form a pixel electrode 27 contacting the drain electrode through the contact hole.

Figure 5B:
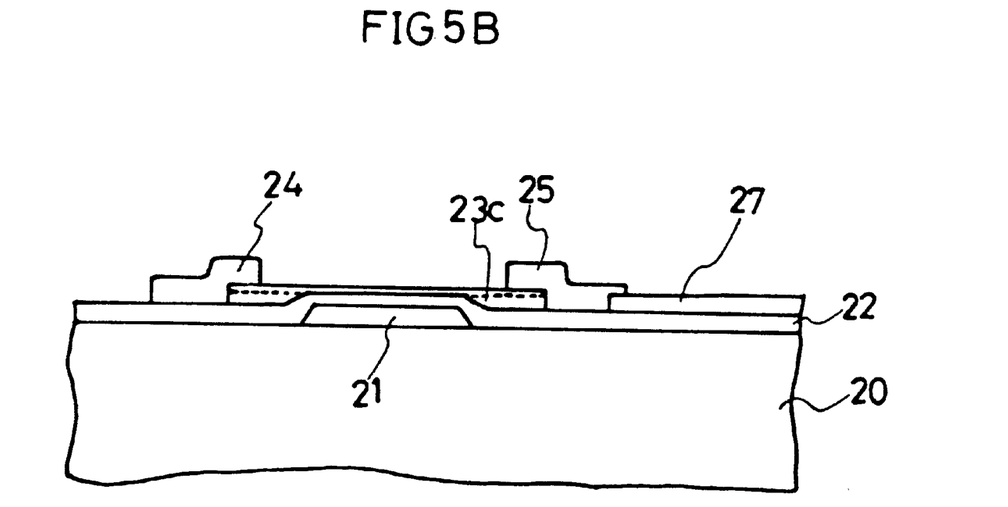

Referring to FIG. 5B, after the crystallization of the active layer (FIG. 4E), a transparent conductive material is deposited on the overall surface of the substrate, and is patterned to form pixel electrode 27 located a predetermined distance away from the active layer 23c. A metal, such as Cr or Al, is deposited thereon, and patterned to form source electrode 24 and drain electrode 25. Here, the drain electrode 25 is so formed as to connect pixel electrode 27 to drain electrode 25.

Figure 5C:
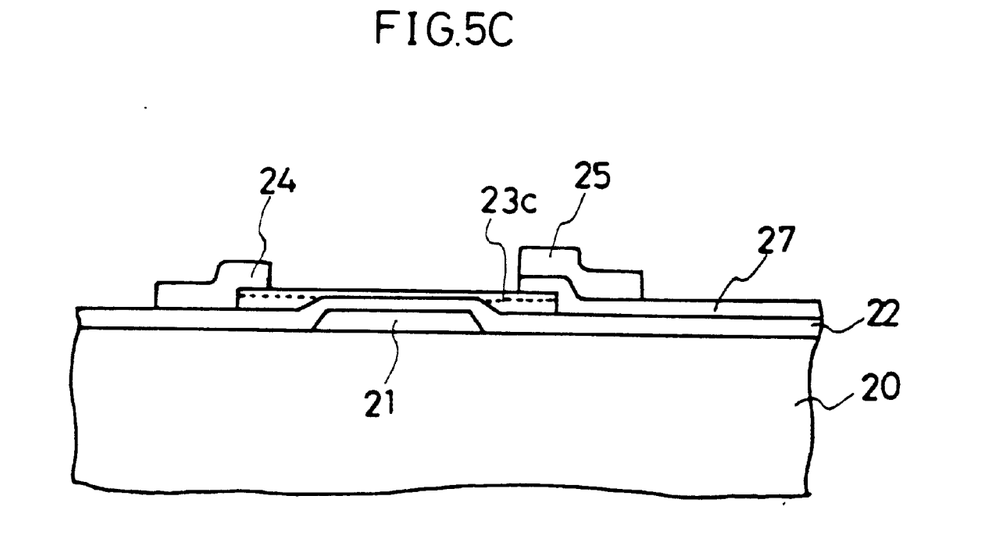

Referring to FIG. 5C, pixel electrode 27 is formed to cover a portion of active layer 23c. That is, after the step of FIG. 4E, a transparent material is deposited on the overall surface of the substrate, and is patterned to form pixel electrode 27 in a such a way as to overlap a portion of active layer 23c. Then, a metal, such as Cr or Al, is deposited thereon, and patterned to form source and drain electrodes 24 and 25.

Figure 5D:
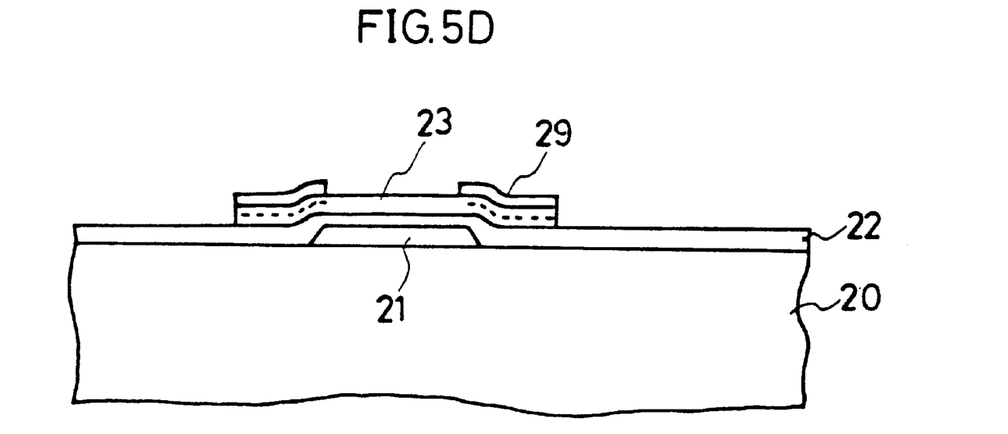

Referring to FIG. 5D, after the active layer 23 is formed in FIG. 4B, instead of plasma-treating active layer 23,n+ amorphous silicon is deposited thereon and patterned to have the same shape as active layer 23. Then, portions of n+ amorphous silicon layer are crystallized through backside laser annealing as in FIG. 4D to form ohmic contact layer 29. Thereafter, a portion of the n+ amorphous silicon layer, which was not laser-annealed, is removed and either one of steps in the foregoing embodiments is performed to form the source and drain electrodes, etc.

As described above, since the TFT fabrication method of the present invention uses neither ion-implantation stop layer nor silicide layer, it does not require the insulating layer deposition, photolithography, etching processes associated with forming the ion-implantation stop layer, or silicide metal deposition and associated etching processes. Furthermore, since the n+ region crystallized by laser has lower resistance, the effective mobility is less affected by the reduction of channel length, as compared with the conventional TFT.

Furthermore, the present invention simplifies the TFT fabrication process and improves the throughput (yield) because it does not require the ion-implantation stop layer or silicide layer. Especially, long-time backside exposure, which has been performed in the conventional process for forming the ion-implantation stop layer, is omitted according to the present invention. Moreover, the resistance of the n+ region is made sufficiently small. Thus, the measured effective mobility is not affected by the short channel length. As a result, high-performance TFTs having higher mobility and lower parasitic capacitance can be realized.

It will be apparent to those skilled in the art that various modifications and variations can be made in the method of fabricating a self-aligned TFT of the present invention without departing from the spirit or scope of the invention. Thus, it is intended that the present invention cover the modifications and variations of this invention provided they come within the scope of the appended claims and their equivalents.

What is claimed is:

1. A method of fabricating a self-aligned TFT on a transparent insulating substrate, the method comprising the steps of:

(a) forming a gate electrode on the transparent insulating substrate;

(b) forming a gate insulating layer over the gate electrode;

(c) forming an active layer made of amorphous silicon over the gate insulating layer adjacent the gate electrode;

(d) performing plasma treatment on the surface of the active layer to convert substantially the entire surface of the active layer into an impurity-doped amorphous silicon layer;

(e) radiating a laser beam from the back side of the transparent insulating substrate using the gate electrode as a mask to substantially crystallize portions of the active layer and the impurity-doped amorphous silicon layer that are exposed to the laser beam, portions of the active layer and the impurity-doped amorphous silicon layer that are shielded by the gate electrode being left as amorphous; and (f) selectively etching the portion of the impurity-doped amorphous silicon layer that is left as amorphous in step (e) using etch-selectivity of amorphous silicon to substantially crystallized silicon.

2. The method according to claim 1, wherein step (d) includes the step of performing plasma enhanced chemical vapor deposition using a mixed gas of $PH_3/H_2$.

3. A method of fabricating a self-aligned TFT on a transparent insulating substrate, the method comprising the steps of:

(a) forming a gate electrode on the transparent insulating substrate;

(b) forming a gate insulating layer over the gate electrode;

(c) forming an active layer made of amorphous silicon over the gate insulating layer adjacent the gate electrode;

(d) forming an ohmic contact regions by depositing ion-doped amorphous silicon over the substantially entire surface of the active layer; and (e) radiating a laser beam toward the back surface of the transparent insulating substrate using the gate electrode as a mask to substantially crystallize portions of the active layer and the ion-doped amorphous silicon that are exposed to the laser beam, portions of the active layer and the ion-doped amorphous silicon that are shielded by the gate electrode being left as amorphous; and (f) selectively etching the portion of the-ion doped amorphous silicon that is left as amorphous in step (e) using etch-selectivity of amorphous silicon to substantially crystallized silicon.

4. A method of manufacturing an inverse-staggered self-aligned thin film transistor on a substrate having a front surface and a back surface, the method comprising the steps of:

(a) forming a gate electrode over the front surface of the substrate;

(b) forming a gate insulating layer over the gate electrode;

(c) forming a semiconductor active layer over the gate insulating layer adjacent the gate electrode;

(d) forming an impurity-doped semiconductor layer over the active layer; and (e) radiating a laser beam toward the back surface of the substrate using the gate electrode as a mask to substantially crystallize portions of the active layer and the impurity-doped semiconductor layer that are exposed to the laser beam to define source and drain regions in the active layer; and (f) selectively etching the portion of the impurity-doped semiconductor layer that is left uncrystallized in step (e) using etch-selectivity of non-crystallized semiconductor to substantially crystallized semiconductor.

5. The method according to claim 4, wherein step (c) includes the steps of:

depositing amorphous silicon over the gate insulating layer; and patterning the amorphous silicon to form the active layer.

6. The method according to claim 4, further comprising the step of selectively thinning the portion of the active layer that is left uncrystallized in step (e) using etch-selectivity of non-crystallized semiconductor to crystallized semiconductor.

7. The method according to claim 4, wherein step (d) includes the step of performing a plasma treatment on the surface of the active layer in an impurity-ions atmosphere to dope impurity-ions into the active layer.

8. The method according to claim 4, wherein step (d) includes the steps of depositing impurity-doped amorphous silicon over the active layer and patterning the impurity-doped amorphous silicon to form the impurity-doped layer.

9. The method according to claim 4, further comprising the steps of forming source and drain electrodes over the active layer, the source and drain electrodes contacting the source and drain regions of the active layer, respectively.

10. The method according to claim 4, further comprising the steps of:

forming source and drain electrodes on the active layer to be in contact with the source and drain regions of the active layer, respectively; and depositing a passivation layer over the entire surface of the substrate including the source and drain electrodes, the active layer, and the gate insulating layer.

11. The method according to claim 10, further comprising the steps of:

etching a portion of the passivation layer to form a contact hole exposing a portion of at least one of the source and drain electrodes; and forming a transparent conductive layer over the passivation layer, the transparent conductive layer being in contact with the at least one of the source and drain electrodes through the contact hole.

12. The method according to claim 4, further comprising the steps of:

forming a transparent conductive layer over the gate insulating layer, the transparent conductive layer being separated from the source and drain regions of the active layer by a predetermined distance; and thereafter, forming source and drain electrodes on the active layer to be respectively in contact with the source and drain regions of the active layer, one of the source and drain electrodes overlaps the transparent conductive layer to be in contact with the transparent conductive layer.

13. The method according to claim 4, further comprising the steps of:

forming a transparent conductive layer over the gate insulating layer, the transparent conductive layer overlapping one of the source and drain regions of the active layer; and thereafter, forming source and drain electrode over the active layer, said one of the source and drain regions being connected with the corresponding one of the source and drain electrodes through the transparent conductive layer, the remaining one of the source and drain electrodes being in contact with the remaining one of the source and drain electrodes.

14. A method of manufacturing an inverse-staggered self-aligned thin film transistor on a substrate having a front surface and a back surface, the method comprising the steps of:

(a) forming a gate electrode over the front surface of the substrate;

(b) forming a gate insulating layer over the gate electrode;

(c) forming an amorphous semiconductor active layer over the gate insulating layer adjacent the gate electrode;

(d) forming an impurity-doped amorphous semiconductor layer over the active layer;

(e) radiating a laser beam toward the back surface of the substrate using the gate electrode as a mask to substantially crystallize portions of the active layer and the impurity-doped semiconductor layer to define source and drain regions in the active layer; and (f) exposing the resulting substrate to an etching condition having an etch-selectivity of amorphous semiconductor to substantially crystallized semiconductor to selectively etch a portion of the impurity-doped semiconductor layer that is located over the gate electrode and is left uncrystallized in step (e).

15. The method according to claim 14, further comprising the step of selectively thinning a portion of the active layer that is left uncrystallized in step (e) using the etch-selectivity of amorphous semiconductor to crystallized semiconductor.

16. The method according to claim 14, wherein step (f) includes the step of performing on the impurity-doped semiconductor layer dry-etching having etch selectivity of amorphous silicon to crystallized silicon to selectively etch the portion of the impurity-doped semiconductor layer that is located over the gate electrode.

17. The method according to claim 14, wherein step (c) includes the steps of:

depositing amorphous silicon over the gate insulating layer; and patterning the amorphous silicon to form the active layer.

18. The method according to claim 14, wherein step (d) includes the step of performing a plasma treatment on the surface of the active layer in an impurity-ions atmosphere to dope impurity-ions into the active layer.

19. The method according to claim 14, wherein step (d) includes the steps of depositing impurity-doped amorphous silicon over the active layer and patterning the impurity-doped amorphous silicon to form the impurity-doped layer.

20. The method according to claim 14, further comprising the steps of forming source and drain electrodes over the active layer, the source and drain electrodes contacting the source and drain regions of the active layer, respectively.

21. The method according to claim 14, further comprising the steps of:

forming source and drain electrodes on the active layer to be in contact with the source and drain regions of the active layer, respectively; and depositing a passivation layer over the entire surface of the substrate including the source and drain electrodes, the active layer, and the gate insulating layer.

22. The method according to claim 21, further comprising the steps of:

etching a portion of the passivation layer to form a contact hole exposing a portion of at least one of the source and drain electrodes; and forming a transparent conductive layer over the passivation layer, the transparent conductive layer being in contact with the at least one of the source and drain electrodes through the contact hole.

23. The method according to claim 14, further comprising the steps of:

forming a transparent conductive layer over the gate insulating layer, the transparent conductive layer being separated from the source and drain regions of the active layer by a predetermined distance; and thereafter, forming source and drain electrodes on the active layer to be respectively in contact with the source and drain regions of the active layer, one of the source and drain electrodes overlaps the transparent conductive layer to be in contact with the transparent conductive layer.

24. The method according to claim 14, further comprising the steps of:

forming a transparent conductive layer over the gate insulating layer, the transparent conductive layer overlapping one of the source and drain regions of the active layer; and thereafter, forming source and drain electrode over the active layer, said one of the source and drain regions being connected with the corresponding one of the source and drain electrodes through the transparent conductive layer, the remaining one of the source and drain electrodes being in contact with the remaining one of the source and drain electrodes.

* * * * *